United States Patent
Eschenweck (12)

(10) Patent No.: US 6,695,129 B1
(45) Date of Patent: Feb. 24, 2004

(54) UNCOVERING DEVICE ON A BELT CONVEYER OF A PICK-AND-PLACE INSTALLATION AND METHOD FOR PICKING AND PLACING COMPONENT USING THE SAME

(75) Inventor: Friedrich Eschenweck, Feldkirchen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/048,166

(22) PCT Filed: Jul. 31, 2000

(86) PCT No.: PCT/DE00/02524

§ 371 (c)(1),
(2), (4) Date: Jan. 29, 2002

(87) PCT Pub. No.: WO01/10183

PCT Pub. Date: Feb. 8, 2001

(30) Foreign Application Priority Data

Jul. 29, 1999 (DE) .......................................... 199 35 818

(51) Int. Cl.⁷ .............................................. B65G 17/12
(52) U.S. Cl. .............................. 198/803.14; 198/867.11
(58) Field of Search ........................ 198/867.11, 803.14

(56) References Cited

U.S. PATENT DOCUMENTS

| | | | | |
|---|---|---|---|---|
| 3,738,315 A | * | 6/1973 | Sweitzer | 198/803.14 X |
| 5,191,693 A | * | 3/1993 | Umetsu | 198/803.14 X |
| 5,339,939 A | * | 8/1994 | Gueble et al. | 198/803.14 X |
| 6,360,866 B1 | * | 3/2002 | Chiba et al. | 198/803.14 |

FOREIGN PATENT DOCUMENTS

| | | |
|---|---|---|
| EP | 460 834 | 12/1991 |
| EP | 817 560 | 1/1998 |
| JP | 11-186788 | 9/1999 |
| JP | 11-8492 | 12/1999 |

* cited by examiner

*Primary Examiner*—James R. Bidwell
(74) *Attorney, Agent, or Firm*—Staas & Halsey LLP

(57) ABSTRACT

An uncovering apparatus may be used on a belt conveyor of a pick-and-place installation having a transporting belt loaded with pick-and-place elements. The pick-and-place elements are covered by a flexible covering and a rigid covering, which may be coupled to one another. This makes it possible for pick-and-place elements to be removed successively in different positions by a removal arrangement without other pick-and-place elements not being covered at any point in time.

12 Claims, 1 Drawing Sheet

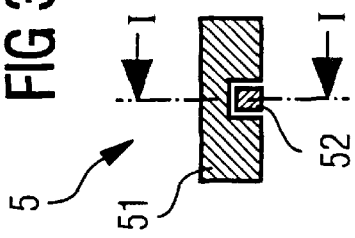
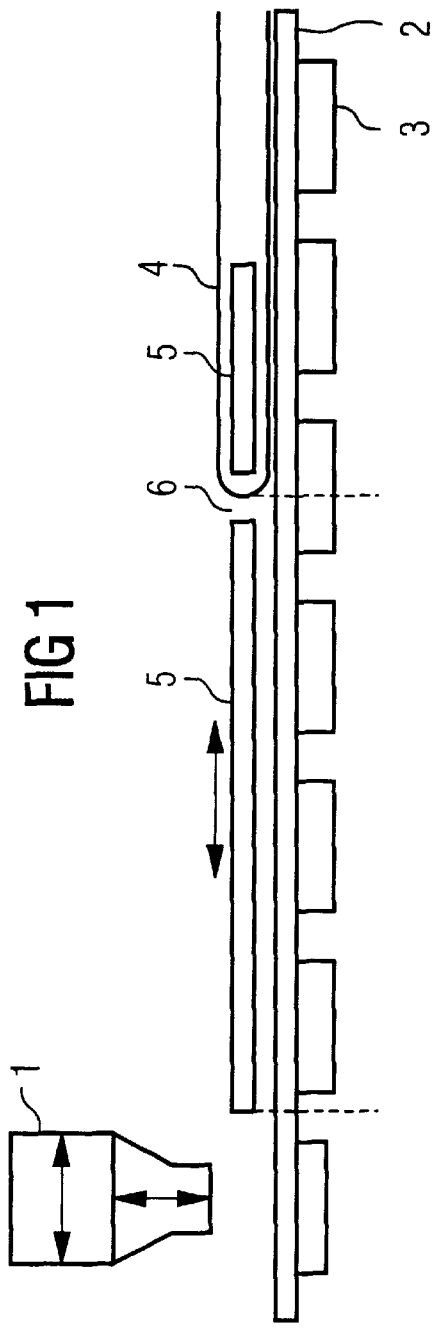
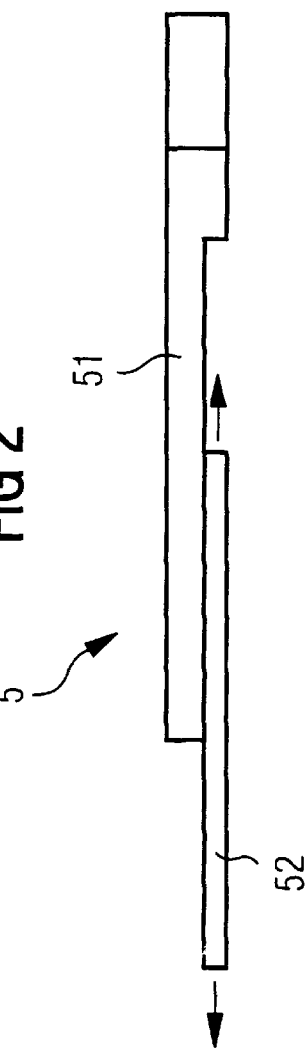

UNCOVERING DEVICE ON A BELT CONVEYER OF A PICK-AND-PLACE INSTALLATION AND METHOD FOR PICKING AND PLACING COMPONENT USING THE SAME

CROSS REFERENCE TO RELATED APPLICATIONS

This application is based on and hereby claims priority to German Application No. 199358818.4 filed on Jul. 29, 1999, the contents of which are hereby incorporated by reference.

BACKGROUND OF THE INVENTION

1. Field of the Invention

The invention relates to an uncovering apparatus on a belt conveyor of a pick-and-place installation having a transporting belt loaded with pick-and-place elements and having a removal arrangement for removing pick-and-place elements. The invention also relates to a pick-and-place method using the uncovering apparatus.

2. Description of the Related Art

Pick-and-place arrangements with a transporting belt which has depressions in which pick-and-place elements are located are known. In order to prevent the pick-and-place elements from falling out of the depressions and to protect them against environmental influences, the depressions are covered by a flexible covering. This covering is drawn off at the start of the transporting belt in order that a removal arrangement can remove the pick-and-place element located in the first, uncovered depression. Following removal of the pick-and-place element by the removal arrangement, the transporting belt, with the sheet material secured, advances by one depression, with the result that, once again, a depression filled with a pick-and-place element is located beneath the removal arrangement and the next removal operation can begin. Following the removal of a certain number of pick-and-place elements, the removal arrangement moves to a further transporting belt in order to remove further pick-and-place elements there. Following completion of one or more further removal operations at one or more further transporting belts, the removal arrangement, finally, returns to the first transporting belt and the operation begins anew. The removal takes place, at each transporting belt, in a fixed position in each case. The transporting belt is moved at a displacement speed, as a result of which the depressions can be moved with adjustment accuracy to predetermined positions. In this case, the removal arrangement is far superior to the transporting belt in respect of adjustment accuracy and displacement speed.

Accordingly, the known pick-and-place arrangements have the disadvantage that the cycle time over which the pick-and-place elements can be removed from the depressions are limited by the transporting belt as the slowest link of the chain. A further reduction in the removal cycle time, which would be possible in principle on account of the quickness of the removal arrangement, cannot be achieved by the known uncovering apparatus.

SUMMARY OF THE INVENTION

The object of the present invention is thus to provide an uncovering apparatus for a belt conveyor of a pick-and-place installation which makes it possible for the cycle time of the removal of pick-and-place elements to be adapted to the dynamics of the removal arrangement.

The invention specifies an uncovering apparatus on a belt conveyor of a pick-and-place installation, it being the case that, in the pick-and-place installation, a transporting belt loaded with pick-and-place elements is provided with a flexible covering by which the pick-and-place elements are covered along a first longitudinal section of the transporting belt as far as a drawing-off position, and it being the case that the pick-and-place installation has a removal arrangement which can be displaced along the transporting belt and is intended for removing pick-and-place elements. The uncovering apparatus according to the invention, which is formed on a belt conveyor of the pick-and-place installation, has a rigid covering by which a plurality of pick-and-place elements are covered along a removal section of the transporting belt, which adjoins the drawing-off position directly, it being possible for the rigid covering to be displaced longitudinally in relation to the transporting belt by a plurality of pick-and-place element spacings, with the result that a number n of pick-and-place elements which corresponds to the plurality can be uncovered successively by the rigid covering.

For this purpose, the rigid covering is preferably designed such that it can be adjusted in a variable manner in length, for example telescopically. This makes it possible using the uncovering apparatus according to the invention, by adjustment of the length, for pick-and-place elements which are covered just by the rigid covering to be uncovered successively.

By virtue of some of the pick-and-place elements being covered according to the invention by a rigid covering, which may be coupled to the flexible covering, it is possible for the pick-and-place elements to be removed by the removal arrangement at different positions relative to the fixed transporting belt. The rigid covering here prevents the situation where the pick-and-place elements fall out of, or down from, the transporting belt prior to the removal by the removal arrangement. The removal of pick-and-place elements from different positions is made possible, furthermore, without the transporting belt being displaced, which is the time-critical factor. The possible coupling of the rigid covering to the flexible covering also makes it possible for pick-and-place elements to be uncovered alongside the displaceable rigid covering, and the rigid covering which can be adjusted in a variable manner in length, without the transporting belt being displaced.

A particularly advantageous uncovering apparatus on a belt conveyor of a pick-and-place installation is one in the case of which the pick-and-place elements are arranged in depressions of the transporting belt. As a result, by simply being positioned in the depressions, the pick-and-place elements may be fitted at defined spacings on the transporting belt without adhesives or the like being used.

A particularly advantageous realization of the coupling between the flexible and rigid coverings is one in the case of which, according to the invention, the rigid covering has a cutout through which the flexible covering is guided, at the drawing-off position, onto those sides of the rigid covering which are directed away from the transporting belt. Such a coupling can be realized particularly easily and cost-effectively.

Furthermore, it is particularly advantageous for the rigid covering to be coupled to a linear motor, which controls its movement and may be integrated, for example, in the covering, or a lifting magnet. Such a straightforward and cost-effective variant is fully sufficient for moving the rigid covering since this does not have to be displaced with the same accuracy as the transporting belt. For example, in the case of depressions in the transporting belt, the rigid covering need only ensure that the pick-and-place elements do not fall out of the depressions. Since the depressions are typically of a length corresponding to the length of the pick-and-place elements, a positioning accuracy for the rigid covering of approximately one third of the length of the depressions is sufficient. In contrast, in order to allow removal by the removal arrangement, it would be necessary for the transporting belt to be positioned with an accuracy of, for example, one tenth of the positioning accuracy of the rigid covering beneath the removal arrangement. The pick-and-place elements which are currently available have dimensions of not less than 0.1 mm×0.1 mm×0.2 mm, further miniaturization being expected.

It is particularly advantageous for the flexible covering to be configured as an adhesive sheet. Such an adhesive sheet prevents the pick-and-place elements from falling out and, at the same time, ensures adhesion of the flexible covering on the transporting belt and, possibly, on the pick-and-place elements.

The invention also specifies a pick-and-place method using the uncovering apparatus according to the invention, in the case of which the rigid covering first of all uncovers the pick-and-place element furthest away from the drawing-off position. Starting from the starting position in the removal section above the pick-and-place element uncovered by the rigid covering, the removal arrangement moves, in the direction of the drawing-off position, toward an end position. During this movement, the rigid covering successively uncovers a number comprising a total of n pick-and-place elements, as required for a pick-and-place cycle, which are removed by the removal arrangement.

In accordance with the advantageous uncovering apparatus on a belt conveyor of a pick-and-place installation having a transporting belt which has depressions, the method in the case of which the pick-and-place elements are removed from depressions of the transporting belt is also particularly advantageous.

Furthermore, in a cyclic method in the case of which the removal arrangement can only cover a limited distance along the transporting belt, it is particularly advantageous if, following removal of the nth pick-and-place element, the removal arrangement returns to the starting position and the transporting belt, together with the rigid and flexible coverings, is displaced by a corresponding amount in the same direction. Following the return of the removal arrangement to the first transporting belt, the removal process may then recommence.

BRIEF DESCRIPTION OF THE DRAWINGS

These and other objects and advantages of the present invention are explained in more detail hereinbelow with reference to an exemplary embodiment and to the associated drawing, in which:

FIG. 1 is a schematic diagram of an uncovering apparatus according to the invention on a belt conveyor of a pick-and-place installation, in a longitudinal section, FIG. 2 shows a section along line 1—1 in FIG. 3, and FIG. 3 is a cross section of the rigid covering according to a preferred embodiment of the invention.

DETAILED DESCRIPTION OF THE PREFERRED EMBODIMENT

FIG. 1 shows an uncovering apparatus according to the invention on a belt conveyor of a pick-and-place installation having a pick-and-place head 1 and a belt 2, which has belt pockets 3 and is covered by a sheet 4 and a rigid covering 5. The covering 5 has a cutout 6 through which the sheet 4 is guided from one side of the covering 5 to the other side of the covering 5. The covering 5 can be moved longitudinally in relation to the belt 2 and, during this movement, simultaneously draws off the sheet 4 from the belt 2. The pick-and-place head 1 can be moved transversely to the belt 2 and can thus remove pick-and-place elements (not illustrated in the figure) from the belt pockets 3 at different positions. Furthermore, the pick-and-place head 1 can be moved perpendicularly to the belt 2 in order to remove the components (not illustrated in the figure) removed from the belt pockets 3 and to fit these, for example, on a printed circuit board.

FIG. 3 shows a further possible configuration of the rigid covering 5. All that is shown is a cross section of the rigid covering which is arranged in the removal section following the drawing-off position (see FIG. 1). The rigid covering is provided here with a main body 51 and a telescopic part 52. The telescopic part 52 can be moved relative to the main body 51. The width of the telescopic part 52 in the transverse direction of the transporting belt 2 (which can be seen from FIG. 1) is very small in comparison with the dimension of the pick-and-place elements, for example SMD resistors or other SMD components. Similarly, the groove formed in the main body 51 is very narrow in comparison with the dimensions of pick-and-place elements. The pick-and-place elements are thus held back reliably both by the main body 51 of the rigid covering 5 and by the telescopic part 52 and cannot leave the transporting belt as long as they are covered either by the main body 51 or by the telescopic part 52.

FIG. 2 shows a section along line 1—1 from FIG. 3, illustrating the ability of the telescopic part 52 to move relative to the main body 51.

Using that embodiment of the rigid covering which can be seen from FIGS. 2 and 3, it is possible for pick-and-place elements from over which the flexible covering 4 has already been removed by removing the rigid covering 5, to be uncovered successively in relation to a removal arrangement 1 for removal purposes.

The telescopic part 52 may be moveable, for example, by an electromagnetic actuator (not shown).

The invention is not restricted to the embodiment which is shown by way of example, but rather is defined in its most general form in the claims and it will be understood that variations and modifications can be effected within the spirit and scope of the invention.

What is claimed is:

1. A belt conveyor with a transporting belt to transport pick-and-place elements towards a drawing-off position, a removal section directly adjoining the drawing-off position and a flexible covering above the pick-and-place elements along a first longitudinal section of the transporting belt as far as the drawing-off position, said belt conveyor comprising:

a removal arrangement, which can be displaced along the transporting belt, to remove the pick-and-place elements; and an uncovering apparatus with a rigid covering to cover a plurality of the pick-and-place elements along the removal section of the transporting belt, said uncovering apparatus displacing the rigid covering longitudinally in relation to the transporting belt at pick-and-place element spacings to uncover a number of pick-and-place elements successively as the flexible covering is removed, the rigid covering including a telescopic part less than half as wide as the pick-and-place elements.

2. The belt conveyor as claimed in claim 1, wherein the rigid covering is coupled to the flexible covering to maintain a position of the rigid covering relative to the drawing-off position as the rigid covering is moved.

3. The belt conveyor as claimed in claim 1, wherein the rigid covering has a cutout through which the flexible covering is guided away from the transporting belt at the drawing-off position.

4. The belt conveyor as claimed in claim 3, wherein said uncovering apparatus further includes a linear motor, coupled to the rigid covering, to control displacement of the rigid covering.

5. A pick-and-place method for pick-and-place elements transported on a belt conveyor having a drawing-off position and a removal section directly adjoining the drawing-off position, the pick-and-place elements being covered by a flexible covering along a first longitudinal section of the transporting belt as far as the drawing-off position, said method comprising:
    moving a rigid covering of a plurality of the pick-and-place elements along the removal section of the transporting belt, longitudinally in relation to the transporting belt to uncover a pick-and-place element furthest away from the drawing-off position as the flexible covering is removed;
    moving a telescopic part of the rigid covering to extend and retract over a portion of the pick-and-place elements, where the telescopic part has a width less than half of the pick-and-place elements;
    moving a removal arrangement along said transporting belt from a starting position in the removal section above the pick-and-place element uncovered by the rigid covering, towards the drawing-off position, until an end position is reached;
    moving the rigid covering to successively uncover a total of n pick-and-place elements; and
    removing the n pick-and-place elements using the removal arrangement.

6. The method as claimed in claim 5, wherein the transporting belt has depressions from which the pick-and-place elements are removed.

7. The method as claimed in claim 6, further comprising, following removal of an nth pick-and-place element:
    returning the removal arrangement to the starting position; and
    displacing the transporting belt, together with the rigid and flexible coverings, by an amount and direction corresponding to said returning of the removal arrangement.

8. An uncovering apparatus in a pick-and-place installation having a transporting belt to transport pick-and-place elements, a flexible covering above the pick-and-place elements along a first longitudinal section of the transporting belt as far as a drawing-off position, and a removal arrangement, which can be displaced along the transporting belt, to remove the pick-and-place elements at a removal section directly adjoining the drawing-off position, said uncovering apparatus comprising:
    a rigid covering to cover a plurality of the pick-and-place elements along the removal section of the transporting belt, the rigid covering including a telescopic part less than half as wide as the pick-and-place elements; and
    a displacement apparatus to displace the rigid covering longitudinally in relation to the transporting belt at pick-and-place element spacings to uncover a number of pick-and-place elements successively as the flexible covering is removed, and to extend and retract the telescopic part to respectively restrain and release the pick-and-place elements.

9. The uncovering apparatus as claimed in claim 8, wherein said rigid covering is coupled to the flexible covering to maintain a position of said rigid covering relative to the drawing-off position as said rigid covering is moved.

10. The uncovering apparatus as claimed in claim 9, wherein said rigid covering has a cutout through which the flexible covering is guided away from the transporting belt at the drawing-off position.

11. The uncovering apparatus as claimed in claim 10, wherein said displacement apparatus includes at least one linear motor, coupled to said rigid covering, to control displacement of said rigid covering.

12. The uncovering apparatus as claimed in claim 10, wherein said displacement apparatus is driven by an electromagnet.

* * * * *